US006559695B2

(12) United States Patent
Ichihara et al.

(10) Patent No.: US 6,559,695 B2
(45) Date of Patent: May 6, 2003

(54) SEMICONDUCTOR CIRCUIT

(75) Inventors: Mayumi nee Matsushita Ichihara, Kusatsu (JP); Takashi Ichihara, Kusatsu (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/107,324

(22) Filed: Mar. 28, 2002

(65) Prior Publication Data

US 2002/0140462 A1 Oct. 3, 2002

(30) Foreign Application Priority Data

Mar. 29, 2001 (JP) ....................................... 2001-094437

(51) Int. Cl.$^{7}$ .................................................. H03L 7/00
(52) U.S. Cl. ....................................... 327/141; 327/163
(58) Field of Search ................................ 327/141, 160, 327/163, 219, 199, 63, 64; 375/354, 355, 364; 365/77, 78, 189.12

(56) References Cited

U.S. PATENT DOCUMENTS

| | | | | |
|---|---|---|---|---|
| 4,224,671 A | * | 9/1980 | Sugiyama et al. | 702/60 |
| 5,684,418 A | * | 11/1997 | Yanagiuchi | 327/99 |
| 5,821,781 A | * | 10/1998 | Rigazio | 327/99 |

* cited by examiner

*Primary Examiner*—Timothy P. Callahan
*Assistant Examiner*—Linh Nguyen
(74) *Attorney, Agent, or Firm*—Parkhurst & Wendel, L.L.P.

(57) ABSTRACT

It is an object of the present invention to provide a semiconductor circuit apparatus that allows an increase in circuit size associated with an increase in number of holders. A counter circuit (102) is used as means for selecting a certain data from data held in a holder. Output data of the counter circuit (102) is compared with data held in the holder by a comparator circuit (103) and data selected according to the result of the comparison is held. This allows a decoder circuit and selector circuit as comparator means to be replaced with the comparator circuit (103) and the holder (106), thereby reducing circuit size.

2 Claims, 8 Drawing Sheets

SEMICONDUCTOR CIRCUIT

FIELD OF THE INVENTION

The present invention relates to a selector apparatus used in a semiconductor circuit apparatus and, more particularly, to a selector apparatus for selecting, according to data provided by a storage, data sent from an element such as a data transfer circuit and outputting the data.

BACKGROUND OF THE INVENTION

FIGS. 6 through 8 show examples of prior-art circuits. FIG. 8 shows a timing chart.

These prior art circuits are used, for example, in a part of a liquid crystal display device where data to be displayed on a liquid crystal panel is converted.

In FIG. 6, a signal S23 outputted from a storage 601 for storing a first signal S20 is inputted as a signal S24 through a decoder circuit 602 into a selector circuit 603 for selecting and outputting one item of data from data appearing on the output signal S25 of a first flip-flop circuit 604. The first flip-flop circuit 604 holds a second signal S21 in synchronization with a third signal S22.

An output signal S26 of the selector circuit 604 is held by a second flip-flop circuit 605 in synchronization with the third signal S22, then outputted as an output signal S27.

The second flip-flop circuit 605 holds the output signal S26 of a selector circuit 303 in synchronization with the leading edge of the third signal S22 in FIG. 8. The signal held by the second flip-flop circuit 605 is provided as S27.

FIG. 7 shows the decoder circuit 602 and selector circuit 603 in an example in which the output signal S23 of the storage 601 is a 3-bit signal.

In a circuit configuration as shown in FIG. 6, the number of circuits of the decoder circuit 602 and selector circuit 603 and therefore the area occupied by them increase as the amount of data handled by the storage 601 increases, resulting in higher chip costs.

The circuit size did not pose the problem in the past because the amount of data handled was relatively small. However, the amount of data handled has increased, the circuit size has become huge and there is the demand for a reduction in circuit size.

It is an object of the present invention to provide a semiconductor circuit apparatus in which an increase in circuit size associated with the increase in the amount of data handled by a storage 601 is small compared with prior-art circuits and therefore the circuit size does not become huge.

DISCLOSURE OF THE INVENTION

A semiconductor circuit apparatus according to the present invention is characterized by replacing a prior-art decoder circuit 602 and selector circuit 603 with a counter circuit, a comparator, and a holder.

According to this configuration, a semiconductor circuit apparatus can be provided in which an increase in circuit size associated with the increase in the amount of data handled by a storage is small and the circuit size does not become huge.

According to claim 1 of the present invention, there is provided a semiconductor circuit apparatus including a selector apparatus selecting and outputting a first serially generated binary signal depending on data held by a first holder, comprising: a second holder for holding the first signal in synchronization with a second signal; a counter circuit for performing a count operation in synchronization with the second signal; a comparator for comparing an output signal of the counter circuit with the data held by the second holder; a selector circuit for selecting and outputting either a signal held by the second holder or another, predetermined timing signal depending on the binary level of a timing signal indicating timing when a match is detected by the comparator means; third hold means for holding an output signal of the selector circuit in synchronization with a third signal; and fourth hold means for holding data held in the third hold means in synchronization with a fourth signal; wherein data held in the third hold means is provided as the predetermined timing signal to the selector circuit and a signal held by the fourth hold means is provided as an output signal.

According to claim 2 of the present invention, there is provided a semiconductor circuit apparatus in which a selector apparatus selecting and outputting a first serially generated binary signal depending on data held by first hold means is provided, comprising: second hold means for holding the first signal in synchronization with a second signal; a counter circuit for performing a count operation in synchronization with the second signal; comparator means for comparing an output signal of the counter circuit with data held in the second hold means; third hold means for holding the data held in the second hold means in synchronization with a timing signal indicating timing at which the comparator means detects a match; and fourth hold means for holding a signal held in the third hold means in synchronization with a third signal, wherein a signal held in the fourth hold means is provided as an output signal.

DESCRIPTION OF THE EMBODIMENTS

Embodiments of the present invention will be described below with respect to FIGS. 1 through 5.

First Embodiment

Figure 1:
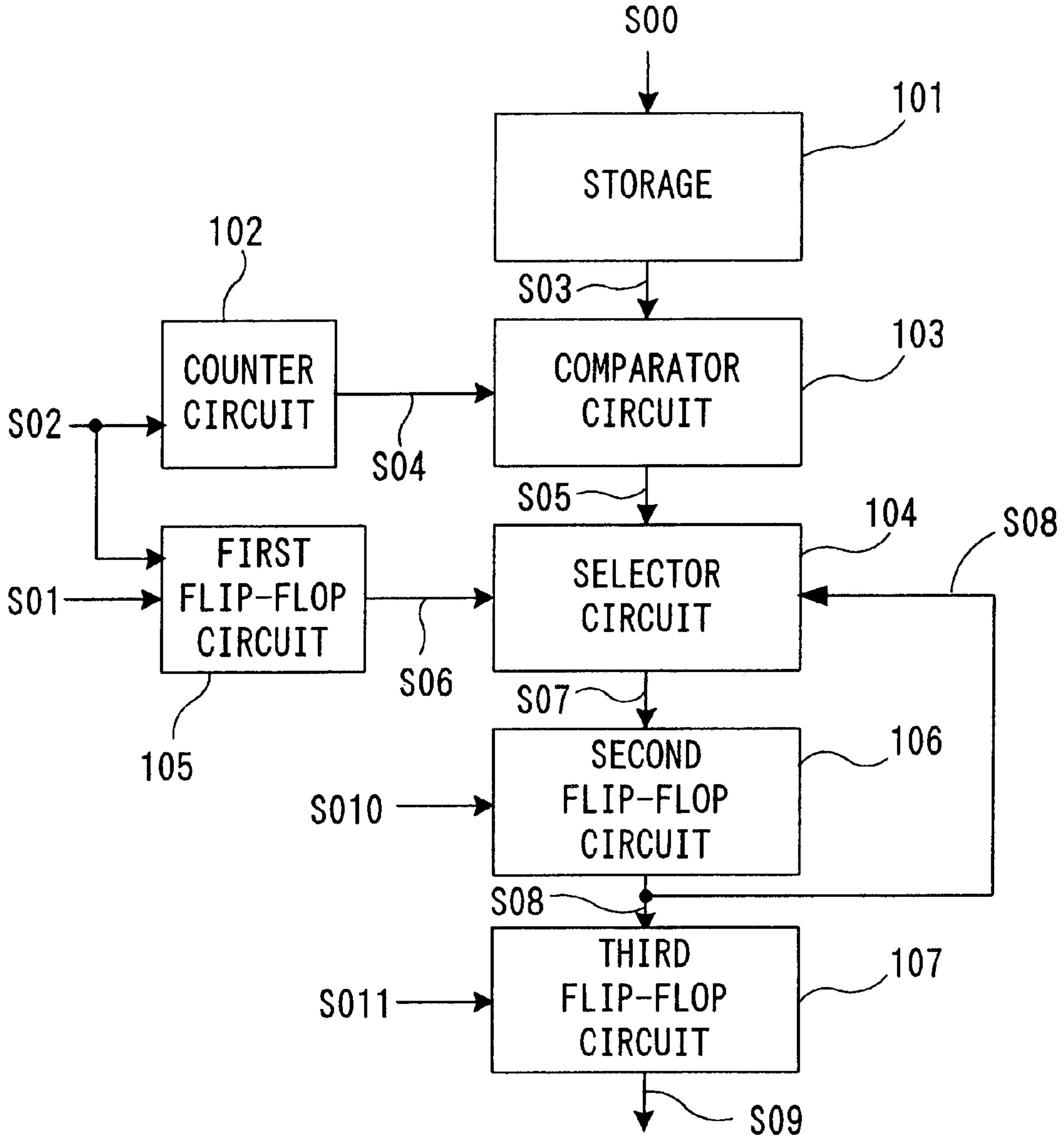
FIG. 1 is a block diagram of a semiconductor circuit apparatus according to a first embodiment of the present invention.
Figure 2:
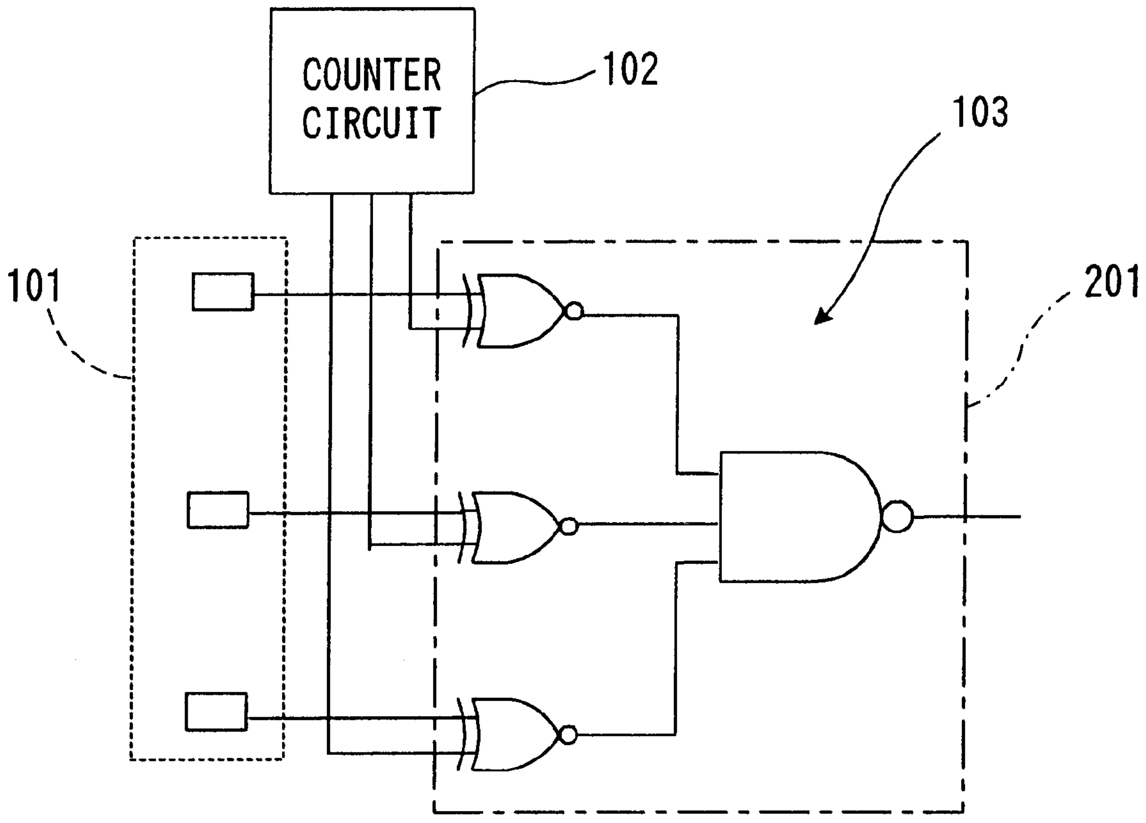
FIG. 2 is a block diagram of a comparator circuit of the first embodiment.
Figure 3:
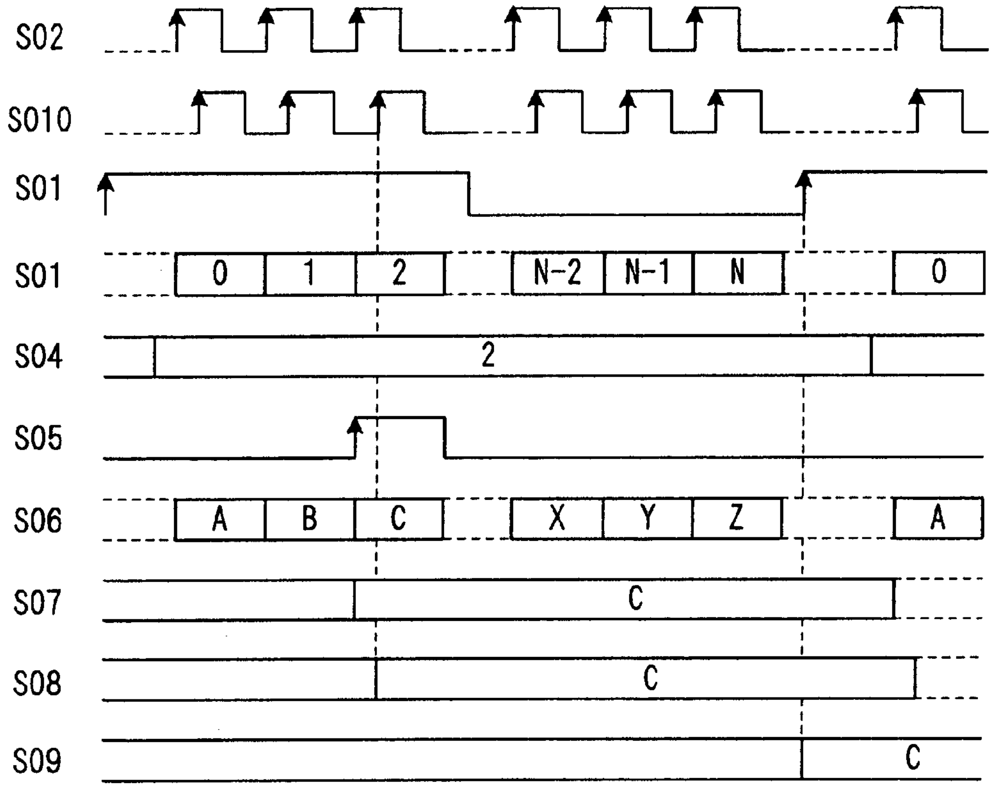
FIG. 3 is a timing chart of the first embodiment.

FIGS. 1 through 3 show a first embodiment of the present invention.

FIG. 1 shows a semiconductor circuit apparatus in which a selector apparatus is provided that selects a first serially generated binary signal S01 according to data S03 held by a storage 101, which is first hold means, and outputs it.

The storage 101 holds an input signal S00 and outputs it as signal S03. A counter circuit 102 performs a count operation in synchronization with a second signal S02 and outputs an output signal S04 indicating a count. A comparator circuit 103, which is comparator means, compares the data S03 held by the storage 101 with the signal S04 outputted from the counter circuit 102 and, when detecting a match, outputs a timing signal S05 indicating the timing.

A first flip-flop circuit 105, which is second hold means, holds the first signal S01 in synchronization with the second signal S02. The first signal S01 is a binary signal generated serially. The fist flip-flop circuit 105 outputs data held by it as a signal S06.

A selector circuit 104 selects and outputs either the signal S06 provided from the first flip-flop circuit 105 or another, predetermined timing signal (S08) depending on the binary level of the timing signal S05 which indicates timing at which the comparator means 103 detect a match. The output signal from the selector circuit 104 is S07.

A second flip-flop circuit 106, which is third hold means, holds the output signal S07 of the selector circuit 104 in synchronization with a third signal S010. The signal held by the second flip-flop circuit 106 is S08, which is provided to the selector circuit 104 as the predetermined timing signal.

A third flip-flop circuit 107, which is fourth hold means, holds the signal S08 held by the second flip-flop circuit 106 in synchronization with a fourth signal S011. The signal held by the third flip-flop circuit 107 is provided as S09.

FIG. 3 shows a timing chart for FIG. 1.

The storage 101 holds a value of 2 as signal S03. The counter circuit 102 counts from 0 to N in synchronization with the leading edge of the second signal S02 as shown as S04. Because the signal held by the storage 101 is a value of 2, the comparator circuit 103 outputs high signal as a signal S05, when the output S04 of the counter circuit 102 becomes 2. It outputs the signal S05 during a period in which the signal S03 held by the storage 101 matches the output signal 504 of the counter circuit 102.

The first flip-flop circuit 105 holds one of signals A–Z, depending on signal S01 at the point in time, in synchronization with the leading edge of the second signal S02 and outputs signal S06 held by the first flip-flop circuit 105.

When the output signal S05 of the comparator circuit 103 goes high, the selector circuit 104 selects the signal S06 held by the first flip-flop circuit 105 and the output signal S07 of the selector circuit 104 takes value C.

The second flip-flop circuit 106 holds the output signal S07 of the selector circuit 104 in synchronization with the leading edge of the fourth signal S010 and the signal S08 held by the second flip-flop circuit 106 takes value C. The third flip-flop circuit 107 holds data S08 held by the second flip-flop circuit 106 in synchronization with the leading edge of a fifth signal S011 and the signal S09 held by the third flip-flop-circuit 107 takes value C.

When the output signal S05 of the comparator 103 goes low, the selector circuit 104 selects and outputs the signal S08.

Figure 7:
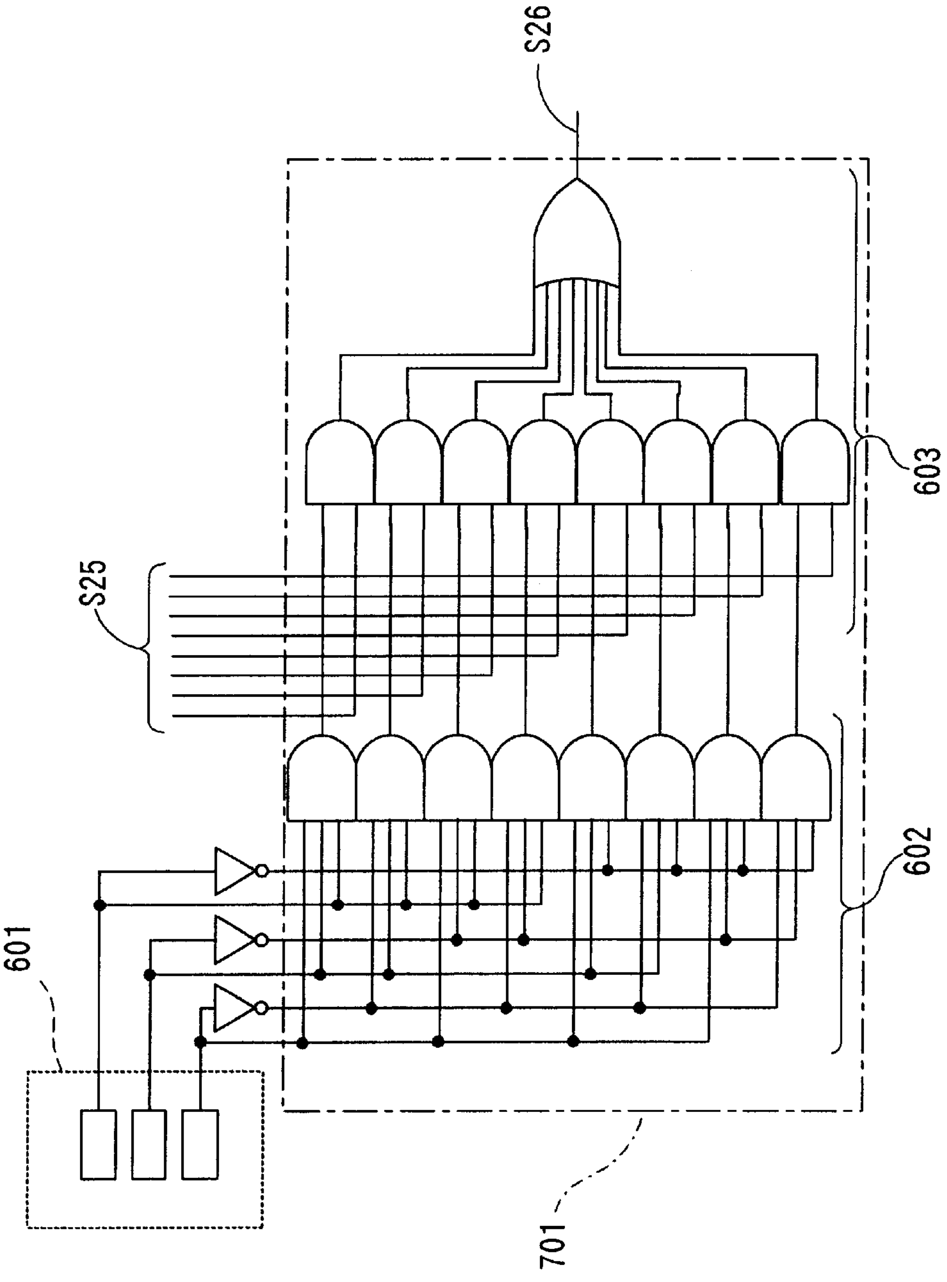
FIG. 7 PRIOR ART
FIG. 7 is a block diagram of a decoder circuit and a selector circuit according to the prior art.
Figure 8:
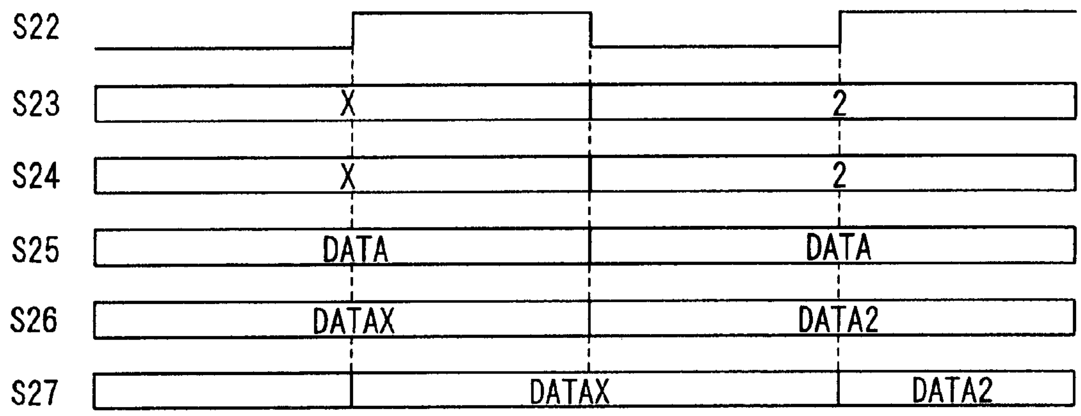
FIG. 8 PRIOR ART
FIG. 8 is a timing chart according to the prior art.

FIG. 2 shows an example of the counter circuit 102 and comparator circuit 103 according to the present invention. Comparing a section proportional to the amount of data handled by a storage, that is, a section 201 enclosed in a dashed line in FIG. 2 with the equivalent section 701 in FIG. 7 which shows the prior-art decoder circuit and selector circuit, it can be seen that the circuit size in the section 201 is reduced compared with the section 701.

In addition, the second flip-flop circuit 106 is used in the present invention. The second flip-flop circuit 106 uses the fourth signal S010 as a sync signal. This configuration is advantageous in that the hold means can be designed with a synchronous technology.

Second Embodiment

Figure 4:
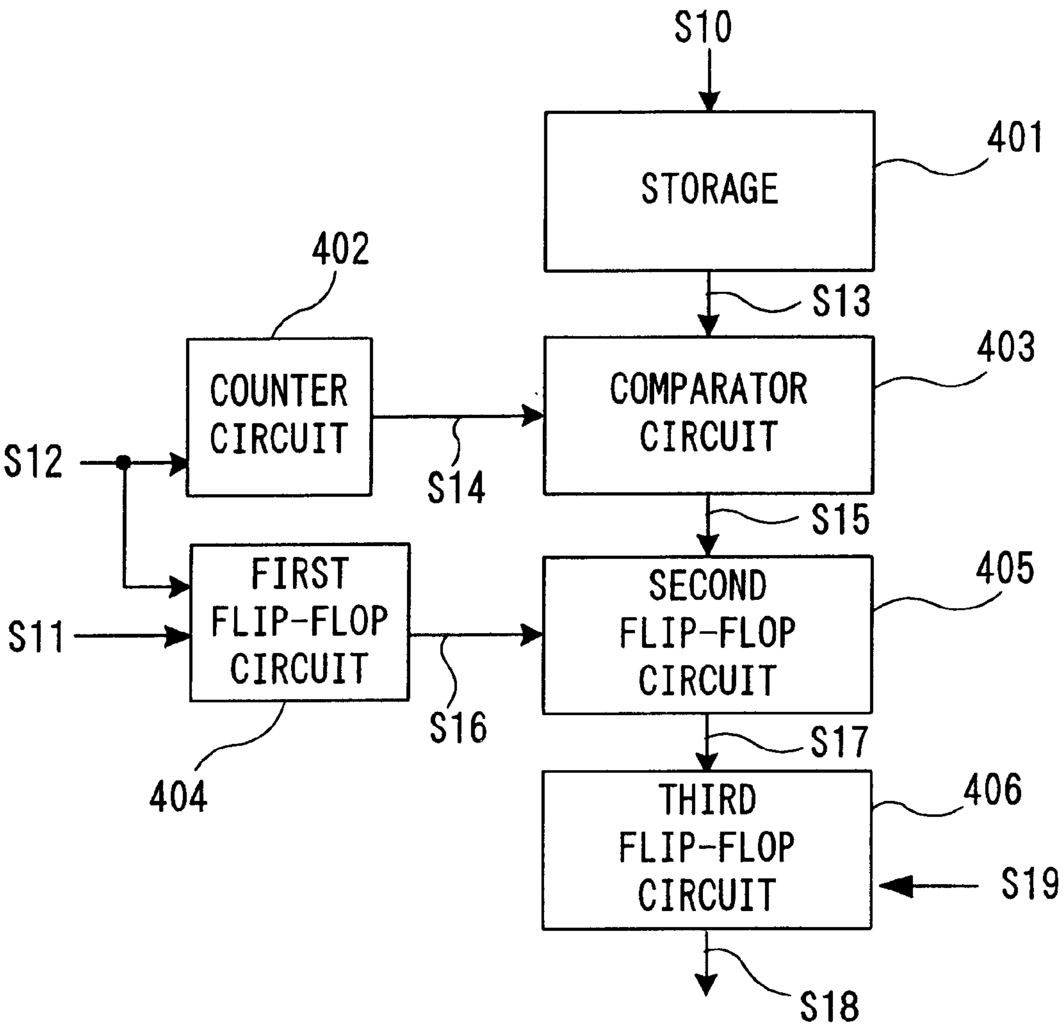
FIG. 4 is a block diagram of a semiconductor circuit apparatus according to a second embodiment of the present invention.
Figure 5:
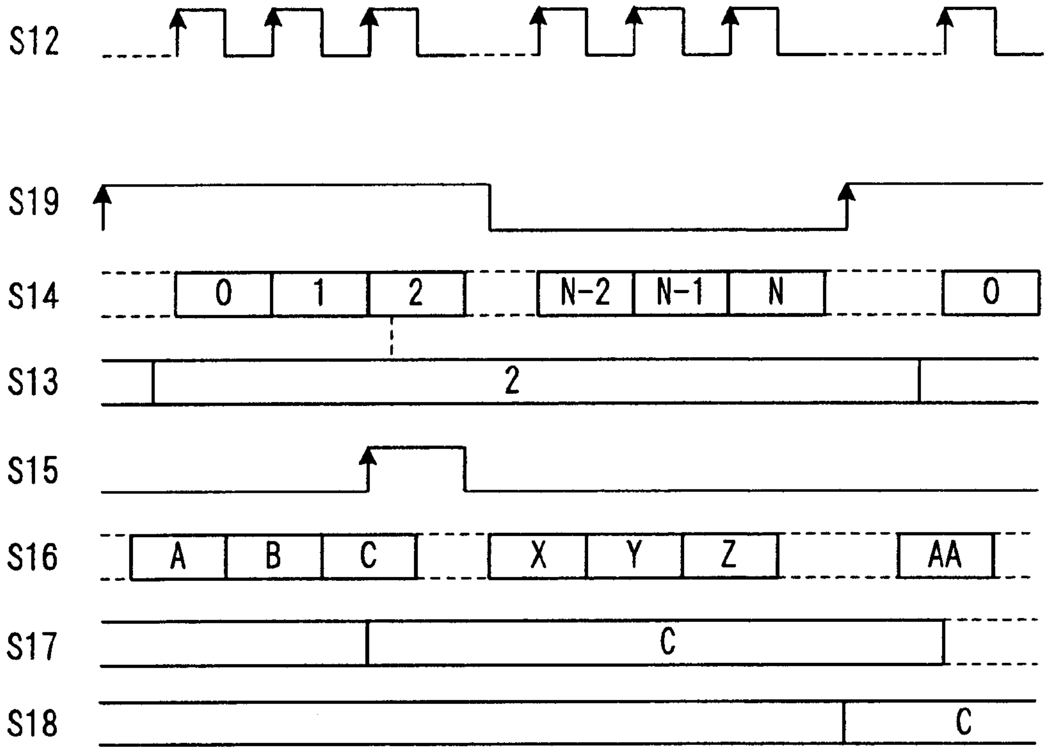
FIG. 5 is a timing chart of the second embodiment.
Figure 6:
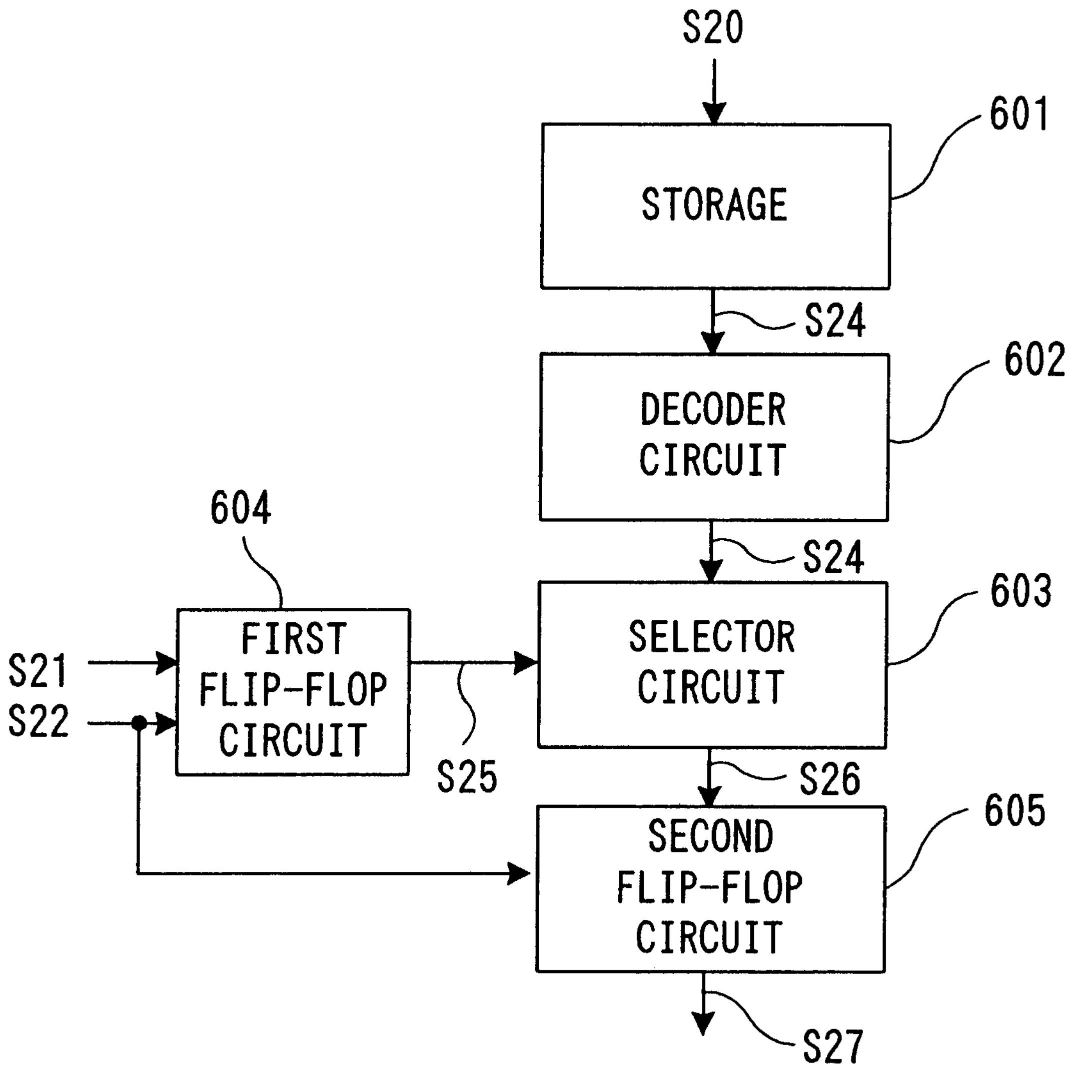
FIG. 6 PRIOR ART
FIG. 6 is a block diagram of a semiconductor circuit apparatus according to a prior art.

FIGS. 4 and 5 show a second embodiment of the present invention.

While the first embodiment employs a synchronization technology, the second embodiment uses an asynchronous technology.

FIG. 4 shows a semiconductor circuit apparatus in which a selector apparatus is provided that selects and outputs a first serially generated binary signal S11 according to data S13 held by a storage 401, which is first hold means. A storage 401 holds an input signal S10. A signal held by the storage 401 is S13. A counter circuit 402 performs a count operation in synchronization with a second signal S12 and outputs a signal S14 indicating its count. A comparator circuit 403, which is comparator means, compares the signal S13 held by the storage 401 with the signal S14 outputted from the counter circuit and outputs a signal S15 of the comparator circuit. A first-flip flop circuit 404, which is second hold means, holds a first signal S11 in synchronization with a second signal S12.

A signal held by the first flip-flop circuit 404 is S16. A second flip-flop circuit 405, which is third hold means, holds a signal S16 held by the first flip-flop circuit 40 in synchronization with the output signal S15 of the comparator circuit 403. The signal held by the second flip-flop circuit 405 is provided as S17.

A third flip-flop circuit 406, which is fourth hold means, holds the signal S17 held by the second flip-flop circuit 405 in synchronization with a third signal S19. The signal held by the third flip-flop circuit 406 is provided as S18.

FIG. 5 shows a timing chart for FIG. 4.

The storage 401 holds a value of 2 as S13. The counter circuit 402 counts 0 to N in synchronization with the leading edge of the second signal S12 as indicated as S14. Because the signal held by the storage 401 is a value of 2, the comparator circuit 403 outputs a high signal S15, when the output signal S14 of the counter circuit 402 becomes 2. It outputs the signal S15 during a period in which the signal S13 held by the storage 401 matches the output signal S14 of the counter circuit 402.

The first flip-flop circuit 404 holds one of signals A–Z in synchronization with the leading edge of the second signal S12 and outputs the signal S16 held by the first flip-flop circuit 404. The second flip-flop circuit 405 holds the signal S16 held by the first flip-flop circuit 404 in synchronization with the leading edge of the output signal S15 of the comparator circuit 403 and the output signal S17 of the second flip-flop circuit 405 takes value C. The third flip-flop circuit 406 holds the signal S17 held by the second flip-flop circuit 405 in synchronization with the leading edge of the third signal S19 and the signal S18 held by the third flip-flop circuit 406 takes value C.

The second flip-flop circuit 405 is used as hold means, which uses as a sync signal the output signal S15 of the comparator circuit 403 provided in the previous stage. This asynchronous design can advantageously reduce the circuit size.

As described above, in a semiconductor circuit apparatus in which a selector apparatus selecting and outputting data provided from a component such as a data transfer circuit according to data provided from a storage is provided, a decoder circuit used in the prior-art is replaced with the counter circuit, comparator means and hold means according to the present invention. As a result, a semiconductor circuit apparatus can be provided in which an increase in circuit size associated with an increase in the amount of data contained in a storage is smaller and therefore the circuit size does not become huge.

What is claimed is:

1. A semiconductor circuit apparatus including a selector apparatus selecting and outputting a first serially generated binary signal depending on data held by a first holder, comprising:

a second holder for holding said first signal in synchronization with a second signal;

a counter circuit for performing a count operation in synchronization with said second signal;

a comparator for comparing an output signal of said counter circuit with the data held by said first holder;

a selector circuit for selecting and outputting either a signal held by said second holder or another, predetermined timing signal depending on the binary level of a timing signal indicating timing when a match is detected by said comparator;

a third holder for holding an output signal of said selector circuit in synchronization with a third signal; and a fourth holder for holding data held in said third holder in synchronization with a fourth signal;

wherein data held in said third holder is provided as said predetermined timing signal to said selector circuit and a signal held by said fourth holder is provided as an output signal.

2. A semiconductor circuit apparatus including a selector apparatus selecting and outputting a first serially generated binary signal depending on data held by a first holder, comprising:

a second holder for holding said first signal in synchronization with a second signal;

a counter circuit for performing a count operation in synchronization with said second signal;

a comparator for comparing an output signal of said counter circuit with data held in said first holder;

a third holder for holding the data held in said second holder in synchronization with a timing signal indicating timing at which said comparator detects a match; and a fourth holder for holding a signal held in said third holder in synchronization with a third signal, wherein a signal held in said fourth holder is provided as an output signal.

* * * * *